United States Patent
Saio et al.

(10) Patent No.: US 10,090,148 B2
(45) Date of Patent: *Oct. 2, 2018

(54) WATER-REPELLENT PROTECTIVE FILM, AND CHEMICAL SOLUTION FOR FORMING PROTECTIVE FILM

(71) Applicant: Central Glass Company, Limited, Ube-shi, Yamaguchi (JP)

(72) Inventors: Takashi Saio, Nabari (JP); Soichi Kumon, Matsusaka (JP); Masanori Saito, Matsusaka (JP); Shinobu Arata, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 552 days.

This patent is subject to a terminal disclaimer.

(21) Appl. No.: 14/415,507

(22) PCT Filed: Jul. 4, 2013

(86) PCT No.: PCT/JP2013/068337
§ 371 (c)(1),
(2) Date: Jan. 16, 2015

(87) PCT Pub. No.: WO2014/013882
PCT Pub. Date: Jan. 23, 2014

(65) Prior Publication Data
US 2015/0179433 A1    Jun. 25, 2015

(30) Foreign Application Priority Data

Jul. 20, 2012  (JP) .................................. 2012-162121
Jun. 4, 2013   (JP) .................................. 2013-117775

(51) Int. Cl.
C09D 5/00     (2006.01)
H01L 21/02    (2006.01)
(Continued)

(52) U.S. Cl.
CPC ...... *H01L 21/02068* (2013.01); *C09D 5/1662* (2013.01); *C09D 5/1681* (2013.01);
(Continued)

(58) Field of Classification Search
CPC ..... C11D 11/0047; C11D 1/004; C11D 1/006; C09D 5/00
(Continued)

(56) References Cited

U.S. PATENT DOCUMENTS 7,838,425 B2    11/2010  Tomita et al.
8,586,208 B2 *  11/2013  Sharma ............... H01L 51/0021
                                                    257/40
(Continued)

FOREIGN PATENT DOCUMENTS

JP    5-299336 A     11/1993
JP    2008-198958 A  8/2008
(Continued)

OTHER PUBLICATIONS

Singaporean Written Opinion issued in counterpart Singaporean Application No. 11201408838S dated Oct. 14, 2015 (Six (6) pages).
(Continued)

*Primary Examiner* — Gregory Webb
(74) *Attorney, Agent, or Firm* — Crowell & Moring LLP

(57) ABSTRACT

A surface treatment was conducted by using a liquid chemical containing a water-repellent protective film forming agent represented by the following general formula [1], subsequent to a step of cleaning a metal-based wafer and prior to a step of drying the wafer.

[1]

(Continued)

($R^1$ represents a $C_1$-$C_{18}$ monovalent hydrocarbon group the hydrogen elements of which may partially or entirely be replaced with a fluorine element(s). $R^2$ mutually independently represents a monovalent organic group having a $C_1$-$C_{18}$ hydrocarbon group the hydrogen elements of which may partially or entirely be replaced with a fluorine element(s). "a" is an integer of from 0 to 2.)

2 Claims, 2 Drawing Sheets

(51) Int. Cl.
<br>　　　　*C09K 3/18*　　　　(2006.01)
<br>　　　　*C09D 5/16*　　　　(2006.01)
<br>　　　　*C11D 1/00*　　　　(2006.01)
<br>　　　　*C11D 1/34*　　　　(2006.01)
<br>　　　　*C11D 3/36*　　　　(2006.01)
<br>　　　　*C11D 3/43*　　　　(2006.01)
<br>　　　　*C11D 7/36*　　　　(2006.01)
<br>　　　　*C11D 11/00*　　　(2006.01)

(52) U.S. Cl.
<br>　　　　CPC ................ *C09K 3/18* (2013.01); *C11D 1/006* (2013.01); *C11D 1/342* (2013.01); *C11D 3/361* (2013.01); *C11D 3/368* (2013.01); *C11D 3/43* (2013.01); *C11D 7/36* (2013.01); *C11D 11/0047* (2013.01); *H01L 21/02057* (2013.01)

(58) Field of Classification Search
<br>　　　　USPC .............................................. 510/175; 106/2
<br>　　　　See application file for complete search history.

(56) References Cited

U.S. PATENT DOCUMENTS

| | | | |
|---|---|---|---|
| 8,828,144 B2* | 9/2014 | Kumon | H01L 21/02057 134/1.1 |
| 8,846,978 B2* | 9/2014 | Hotchkiss | C07F 9/3808 568/11 |
| 8,932,390 B2* | 1/2015 | Saio | H01L 21/02068 106/2 |
| 9,349,582 B2* | 5/2016 | Kumon | H01L 21/02068 |
| 2011/0114935 A1* | 5/2011 | Sharma | H01L 51/0021 257/40 |
| 2012/0114974 A1* | 5/2012 | Hotchkiss | C07F 9/3808 428/702 |
| 2012/0174945 A1* | 7/2012 | Saio | H01L 21/02068 134/4 |
| 2012/0211025 A1* | 8/2012 | Kumon | H01L 21/02057 134/3 |
| 2012/0272999 A1* | 11/2012 | Kumon | H01L 21/02068 134/4 |
| 2013/0104931 A1 | 5/2013 | Arata et al. | |

FOREIGN PATENT DOCUMENTS

| | | |
|---|---|---|
| JP | 4403202 B1 | 1/2010 |
| JP | 2010-129932 A | 6/2010 |
| JP | 2012-33890 A | 2/2012 |
| WO | WO 2010/047196 A1 | 4/2010 |
| WO | WO 2012/096133 A1 | 7/2012 |

OTHER PUBLICATIONS

International Search Report (PCT/ISA/210) dated Sep. 3, 2013, with English translation (Three (3) pages).

\* cited by examiner

WATER-REPELLENT PROTECTIVE FILM, AND CHEMICAL SOLUTION FOR FORMING PROTECTIVE FILM

TECHNICAL FIELD

The present invention relates to a technique for cleaning a substrate (a wafer) in semiconductor device fabrication and the like, and particularly to a water-repellent protective film and a liquid chemical for forming a protective film.

BACKGROUND OF THE INVENTION

Semiconductor devices for use in networks or digital household electric appliances are desired to be further sophisticated, multifunctional, and low in power consumption. Accordingly, the trend toward micro-patterning for circuits has been developed, with which a pattern collapse of the circuits has been becoming controversial. In semiconductor device fabrication, cleaning steps for the purpose of removing particles and metallic impurities are frequently employed, which results in a 30-40% occupation of the whole of a semiconductor fabrication process by the cleaning step. If the aspect ratio of the pattern is increased with the trend toward micro-patterning of the semiconductor devices, the pattern is to cause its collapse when a gas-liquid interface passes therethrough after cleaning or rinsing at the time of drying the wafer. This phenomenon is pattern collapse.

In Patent Publication 1, there is disclosed a technique of changing a cleaning liquid from water to 2-propanol before a gas-liquid interface passes through a pattern, as a method for suppressing pattern collapse. However, it is said that there are some limitations, for example, an adaptable aspect ratio of pattern is not higher than 5.

Additionally, in Patent Publication 2, there is disclosed a technique directed toward a resist pattern, as a method for suppressing pattern collapse. This is a method of decreasing a capillary force as much as possible thereby suppressing pattern collapse.

However, the technique disclosed as above is directed toward the resist pattern and is for reforming a resist itself. Moreover, a treatment agent can finally be removed together with the resist, so that it is not necessary to estimate a process of removing it after drying; therefore, this technique cannot be applied to the object of the present invention.

Furthermore, Patent Publication 3 discloses a cleaning process for preventing pattern collapse, in which surface-reforming by oxidation or the like is conducted on a wafer surface provided to have an uneven pattern by a film containing silicon, and a water-repellent protective film is formed on the surface by using a water-soluble surfactant or a silane coupling agent to reduce the capillary force.

Additionally, in Patent Publications 4 and 5, there is disclosed a technique of preventing pattern collapse by performing a hydrophobicity-providing treatment with use of a treatment liquid containing a silylation agent (represented by N,N-dimethylaminotrimethylsilane) and a solvent.

REFERENCES ABOUT PRIOR ART

Patent Documents

Patent Publication 1: Japanese Patent Application Publication No. 2008-198958
Patent Publication 2: Japanese Patent Application Publication No. 5-299336
Patent Publication 3: Japanese Patent No. 4403202
Patent Publication 4: Japanese Patent Application Publication No. 2010-129932
Patent Publication 5: International Application Publication No. 10/47196 Pamphlet

SUMMARY OF THE INVENTION

Problems to be Solved by the Invention

The present invention relates to a technique for cleaning a substrate (a wafer) in semiconductor device fabrication and the like, the objective of which is to enhance the production yield of devices having such a circuit pattern as to be particularly fine and high in aspect ratio, and particularly to a liquid chemical for forming a water-repellent protective film and the like the objective of which is to improve a cleaning step where a wafer having at its surface an uneven pattern tends to cause a collapse of the uneven pattern.

Hitherto, there has generally been used a wafer containing silicon element at its surface; however, a wafer that contains an element such as titanium, tungsten, aluminum, copper, tin, tantalum and ruthenium (hereinafter, sometimes referred to as "metal-based elements") at its surface has become used together with the diversification of the pattern. However, in a case of a wafer containing a substance where reactive functional groups e.g. silanol groups does not sufficiently exist (just like the above-mentioned wafer containing a metal-based element at its surface), it is not possible to form a water-repellent protective film for preventing pattern collapse even if the treatment liquid or the treatment method discussed in Patent Publications 3 to 5 is employed, which is a problem in that pattern collapse cannot be prevented.

As a result of the present inventors' eager studies, it was found that the wafer containing a metal-based element at its surface can gain water repellency at its surface by being subjected to a surface treatment with a liquid chemical containing a compound represented by the following general formula [1], and that the water repellency-imparting effect gets better with higher concentration of the compound.

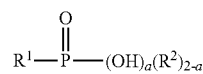

[1]

(In the formula [1], $R^1$ represents a $C_1$-$C_{18}$ monovalent hydrocarbon group the hydrogen elements of which may partially or entirely be replaced with a fluorine element(s), $R^2$ mutually independently represents a monovalent organic group having a $C_1$-$C_{18}$ hydrocarbon group the hydrogen elements of which may partially or entirely be replaced with a fluorine element(s), and "a" is an integer of from 0 to 2.)

However, when the compound represented by the general formula [1] has high concentration and the liquid chemical containing the compound is retained at low temperature, the compound is sometimes precipitated out of the liquid chemical as a solid matter. Such a solid matter arouses a fear of contaminating the wafer surface at the time of cleaning the wafer by taking the form of particles and a fear of damaging the wafer pattern.

An object of the present invention is to provide a liquid chemical for forming a water-repellent protective film, the liquid chemical being for forming a water-repellent protective film on a wafer having at its surface an uneven pattern and containing at least one kind of element selected from the group consisting of titanium, tungsten, aluminum, copper, tin, tantalum and ruthenium at surfaces of recessed portions of the uneven pattern (hereinafter, the wafer may be referred to as "a metal-based wafer" or merely "a wafer"), the film being formed at least on the surfaces of the recessed portions of the wafer to adequately reduce an interaction between liquid retained in the recessed portions and the surfaces of the recessed portions thereby improving a cleaning step which tends to induce pattern collapse, the liquid chemical for forming a protective film being save from precipitation of a solid matter at low temperature.

Means for Solving the Problems

Pattern collapse is to occur when a gas-liquid interface passes through a pattern at the time of drying a wafer after cleaning it with a cleaning liquid. The reason therefor is said that a difference in height of residual liquid of the cleaning liquid between a part having high aspect ratio and a part having low aspect ratio causes a difference in capillary force which acts on the pattern.

Accordingly, it is expected, by decreasing the capillary force, that the difference in capillary force due to the difference in height of residual liquid is reduced thereby resulting in the dissolution of pattern collapse. The magnitude of the capillary force is the absolute value of P obtained by the equation as shown below. It is expected from this equation that the capillary force can be reduced by decreasing $\gamma$ or $\cos \theta$.

$$P = 2 \times \gamma \times \cos \theta / S$$

(In the equation, $\gamma$ represents the surface tension of liquid retained in the recessed portions, $\theta$ represents the contact angle of the liquid retained in the recessed portions to the surfaces of the recessed portions, and S represents the width of the recessed portions.)

In the present invention, the protective film is formed at least on the surfaces of the recessed portions of the uneven pattern when liquid that remains on the recessed portions after the water-repellent protective film is formed is removed or dried out of the recessed portions. Therefore, the capillary force which acts on the recessed portions is so reduced that pattern collapse becomes difficult to occur. Additionally, the protective film is to be removed after the drying step.

In the present invention, the protective film means a film that can reduce the wettability of the wafer surface by being formed on the wafer surface, and more specifically, a film which is able to impart water repellency to the same. In the present invention, water repellency means to decrease a surface energy of a surface of an article thereby weakening the interaction (such as a hydrogen bond, intermolecular forces and the like) between water or other liquid and the surface of the article (i.e., at the interface). The effect of reducing the interaction is particularly exhibited in the case of water, but the effect of reducing the interaction is exhibited also in the case of a mixture liquid of water and a liquid other than water or in the case of a liquid other than water. With such a reduction of the interaction, the contact angle of liquid to the article surface can be increased.

A liquid chemical for forming a pure water-repellent protective film (hereinafter, sometimes referred to as "a liquid chemical for forming a protective film" or merely "a liquid chemical") according to the present invention is a liquid chemical for forming a pure water-repellent protective film on a wafer having at its surface an uneven pattern and containing at least one kind of element selected from the group consisting of titanium, tungsten, aluminum, copper, tin, tantalum and ruthenium at surfaces of recessed portions of the uneven pattern, the pure water-repellent protective film (hereinafter, sometimes referred to as merely "a protective film") being formed at least on the surfaces of the recessed portions subsequent to a step of cleaning the wafer and prior to a step of drying the wafer, the liquid chemical for forming a pure water-repellent protective film being characterized by comprising: a pure water-repellent protective film forming agent represented by the following general formula [1] (hereinafter, sometimes referred to as merely "a protective film forming agent"); and a solvent, wherein the solvent comprises an alcohol having a carbon number of 6 or less; pure water; or both of the alcohol and pure water, the pure water-repellent protective film forming agent has a concentration of 0.05 to 2 mass % relative to the total amount of 100 mass % of the liquid chemical for forming a pure water-repellent protective film, pure water has a concentration of 0 to 80 mass % relative to the total amount of 100 mass % of the solvent, the alcohol has a concentration of 0 to 80 mass % relative to the total amount of 100 mass % of the solvent, and the total concentration of the alcohol and pure water is 0.8 to 100 mass % relative to the total amount of 100 mass % of the solvent. Incidentally, "the total concentration of the alcohol and pure water is 0.8 to 100 mass %" means that the solvent in the liquid chemical of the present invention constitutes the total amount of 100% by summing up the amounts of alcohol, pure water and other solvents, and therefore it means that the concentration of alcohol and pure water becomes 100 mass % when other solvents are not contained.

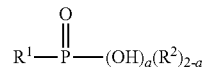

[1]

(In the formula [1], $R^1$ represents a $C_1$-$C_{18}$ monovalent hydrocarbon group the hydrogen elements of which may partially or entirely be replaced with a fluorine element(s), $R^2$ mutually independently represents a monovalent organic group having a $C_1$-$C_{18}$ hydrocarbon group the hydrogen elements of which may partially or entirely be replaced with a fluorine element(s), and "a" is an integer of from 0 to 2.)

By using the protective film forming agent represented by the general formula [1], it becomes possible to form a water repellent protective film at least on the surfaces of the recessed portions of the metal-based wafer. Furthermore, the water-repellent protective film according to the present invention is a water-repellent protective film formed on a wafer having at its surface an uneven pattern and containing at least one kind of element selected from the group consisting of titanium, tungsten, aluminum, copper, tin, tantalum and ruthenium at surfaces of recessed portions of the uneven pattern, the water-repellent protective film being formed at least on the surfaces of the recessed portions, by retaining the liquid chemical for forming a protective film at least in the recessed portions subsequent to a step of cleaning the wafer and prior to a step of drying the wafer. The water-repellent protective film may be formed of; the compound serving as the water-repellent protective film forming agent represented by the general formula [1]; or a reactant containing the compound as the principal component.

In the protective film forming agent, P—OH group and/or P=O group (hereinafter, these groups may be referred to as "a functional moiety") have compatibility with a substance containing the above-mentioned metal-based elements. Incidentally, "have compatibility" means that Van der Waals force, a static interaction or the like acts between the surface of the substance containing the metal-based elements and the functional moiety of the protective film forming agent thereby causing adsorption and/or that the surface of the substance is reacted with the functional moiety of the protective film forming agent to build a chemical bond thereby causing adsorption. Additionally, $R^1$ is a hydrophobic moiety of the protective film forming agent; therefore, when the protective film forming agent is adsorbed on the metal-based elements in a metal-based wafer, hydrophobic moieties are arranged outwardly from the surface of the wafer thereby imparting water repellency to the wafer surface.

In order to improve the liquid chemical for forming a water-repellent protective film of the present invention in performance capability to impart water repellency to the wafer surface, it is effective to increase the concentration of the protective film forming agent. However, the protective film forming agent according to the present invention is sometimes difficult to dissolve in an organic solvent or water, and therefore a high concentration of a protective film forming agent is required to be dissolved in an organic solvent or water in a short time. Additionally, the liquid chemical for forming a protective film is sometimes stored at a low temperature of 0° C. or lower, and therefore desired to have difficulty in precipitating a solid matter out thereof at such a low temperature. Once the solid matter has been precipitated out, it becomes difficult to fully dissolve the solid matter in the liquid chemical even by bringing the temperature of the liquid chemical back to room temperature, and therefore a condition where the solid matter remains tends to survive. Thus it is preferable that the liquid chemical has difficulty in precipitating a solid matter out thereof even if stored at lower temperatures, more preferably the solid matter is not precipitated out even if the storage temperature is not higher than 0° C., much more preferably the solid matter is not precipitated out even if the storage temperature is not higher than −30° C. When the solvent for the liquid chemical for forming a water-repellent protective film according to the present invention is a solvent that contains an alcohol having a carbon number of 6 or less; water; or both of the alcohol and water, and has a concentration of water of 0 to 80 mass % relative to the total amount of 100 mass % of the solvent; a concentration of alcohol of 0 to 80 mass % relative to the total amount of 100 mass % of the solvent; and the total concentration of the alcohol and water of 0.8 to 100 mass % relative to the total amount of 100 mass % of the solvent, the solubility of the protective film forming agent is improved thereby and therefore it becomes possible to dissolve the protective film forming agent therein in a short time even if the protective film forming agent has a relatively high concentration such as 0.05 to 2 mass %. In addition, a liquid chemical for forming a water-repellent protective film, in which a solid matter is hardly precipitated out even if the liquid chemical is stored at a low temperature, can be provided. However, when the concentration of water is larger than 80 mass % or the total concentration of the alcohol and water is smaller than 0.8 mass %, the solid matter is easily precipitated out by storing the liquid chemical at a low temperature. Furthermore, a concentration of the alcohol of larger than 80 mass % tends to reduce the water repellency-imparting effect.

The concentration of the protective film forming agent in the liquid chemical for forming a protective film is 0.05 to 2 mass % relative to the total amount of 100 mass % of the liquid chemical. In order to impart a sufficient water repellency to a wafer surface, it is preferable that the lower limit of the concentration is 0.05 mass %. Meanwhile, if the concentration is larger than 2 mass %, there are a case where the protective film forming agent cannot be fully dissolved in the liquid chemical so that an undissolved component sometimes remains in the form of a solid matter and a case where a component that tends to easily precipitate out at a low temperature environment is precipitated and remains in the form of a solid matter. The concentration is preferably 0.05 to 1 mass %, more preferably 0.08 to 0.8 mass %.

The presence of a solid matter precipitated out by storing the liquid chemical for forming a protective film at a low temperature or a solid matter not fully dissolved at the time of preparing the liquid chemical for forming a protective film so as to remain in the liquid chemical (i.e. the protective film forming agent) can be determined by visually observing the liquid chemical. It is also possible to calculate the number of fine particles that exist in the liquid chemical by using a commercially available particle counter to determine its amount.

Additionally, it is preferable that the protective film forming agent is a compound represented by the following general formula [2].

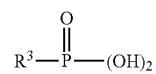

[2]

(In the formula [2], $R^3$ represents a $C_1$-$C_{18}$ monovalent hydrocarbon group the hydrogen elements of which may partially or entirely be replaced with a fluorine element(s).)

Furthermore, it is preferable that 0.8 to 80 mass % of water is contained in the total amount of 100 mass % of the solvent for the liquid chemical for forming a water-repellent protective film. When the concentration of water is smaller than 0.8 mass %, a solid matter is easily precipitated out by storing the liquid chemical at a low temperature. The concentration of water is more preferably 1 to 75 mass %.

It is further preferable that 1 to 75 mass % of water and 0.05 to 60 mass % of an alcohol having a carbon number of 6 or less are contained in the total amount of 100 mass % of the solvent for the liquid chemical for forming a water-repellent protective film. If the concentration of an alcohol is smaller than 0.05 mass %, the protective film forming agent becomes difficult to dissolve in a short time. Meanwhile, a concentration of an alcohol of larger than 60 mass % tends to lower the water repellency-imparting effect of the liquid chemical for forming a protective film. The concentration of an alcohol is more preferably 0.08 to 50 mass %, much more preferably 0.1 to 40 mass %. Furthermore, the concentration of an alcohol in the liquid chemical for forming a water-repellent protective film is preferably not less than that of the protective film forming agent.

As the above-mentioned metal-based wafer, it is possible to cite: a wafer containing at least one kind of element selected from the group consisting of titanium, tungsten, aluminum, copper, tin, tantalum and ruthenium at the surfaces of the recessed portions of the uneven pattern; preferably a wafer containing at least one kind of element selected from the group consisting of titanium, tungsten, aluminum and ruthenium; further preferably a wafer containing titanium element and ruthenium element; and still further preferably a wafer containing titanium element. In a case of a wafer containing silicon element at the surfaces of the recessed portions of the uneven pattern, there are a great number of silanol groups (SiOH groups) on the surfaces. These silanol groups serve as reaction points to be reacted with a silane coupling agent, so that the water-repellent protective film can easily be formed on the surfaces of the recessed portions. On the other hand, in a case of the metal-based wafer, its surface has fewer reaction points such as the silanol groups and therefore it is difficult to form the protective film by a compound such as the silane coupling agent. Additionally, in the present invention, "a wafer having at its surface an uneven pattern" means a wafer which is in a condition where the uneven pattern has already been formed on the surface by etching, imprint or the like. Moreover, it is possible to adopt a wafer on which another process such as metal routing has been performed, as far as the wafer has an uneven pattern at its surface.

The liquid chemical for forming a protective film, according to the present invention is used in such a manner as to substitute a cleaning liquid with the liquid chemical in a step of cleaning the metal-based wafer. Additionally, the substituted liquid chemical may be substituted with another cleaning liquid.

While the cleaning liquid is substituted with the liquid chemical for forming a protective film after the cleaning step and the liquid chemical is retained at least in the recessed portions of the uneven pattern as discussed above, the protective film is formed at least on the surfaces of the recessed portions of the uneven pattern. The protective film of the present invention may not necessarily continuously be formed and may not necessarily uniformly be formed. However, in order to impart more excellent water repellency, it is preferable to form the protective film continuously and uniformly.

Moreover, the present invention is a method of producing a liquid chemical for forming a water-repellent protective film, characterized by mixing a solvent that contains an alcohol having a carbon number of 6 or less and/or water with a water-repellent protective film forming agent thereby obtaining the above-mentioned liquid chemical for forming a water-repellent protective film.

Additionally, in the method of producing a liquid chemical for forming a water-repellent protective film, it is preferable to mix a solution where the water-repellent protective film forming agent is dissolved in the alcohol having a carbon number of 6 or less with the solvent that contains the alcohol having a carbon number of 6 or less and/or water thereby obtaining the liquid chemical for forming a water-repellent protective film.

The protective film forming agent has high solubility in an alcohol having a carbon number of 6 or less. Hence it is preferable to prepare a liquid chemical for forming a water-repellent protective film by dissolving a water-repellent protective film forming agent in an alcohol having a carbon number of 6 or less and then by mixing the solution with a solvent that contains an alcohol having a carbon number of 6 or less and/or water. With this, a liquid chemical for forming a water-repellent protective film, in which the water-repellent protective forming agent does not remain undissolved can be produced in a short time.

Furthermore, the method of cleaning a wafer is a method of cleaning a wafer having at its surface an uneven pattern and containing at least one kind of element selected from the group consisting of titanium, tungsten, aluminum, copper, tin, tantalum and ruthenium at surfaces of recessed portions of the uneven pattern, the method being characterized by involving at least: a protective film-forming step for retaining the liquid chemical for forming a protective film at least in the recessed portions of the uneven pattern; a drying step for removing liquid from the uneven pattern by drying; and a film removal step for removing the protective film.

Moreover, in the method of cleaning a wafer as mentioned above, the liquid chemical may be one that had been stored at a low temperature of 0° C. or lower and then brought back to room temperature.

Effects of the Invention

The protective film formed from the liquid chemical for forming a protective film according to the present invention is excellent in water repellency. Therefore, on a wafer having at its surface an uneven pattern and containing at least one kind of element selected from the group consisting of titanium, tungsten, aluminum, copper, tin, tantalum and ruthenium at surfaces of recessed portions of the uneven pattern, the film adequately reduces the interaction between liquid retained in the recessed portions and the surfaces of the recessed portions, thereby exhibiting the effect of preventing pattern collapse. In addition, the liquid chemical has difficulty in precipitating a solid matter out thereof even if stored at a low temperature. Therefore, by using the liquid chemical, a cleaning step conducted in a process for producing the wafer having at its surface an uneven pattern is improved without lowering throughput. Accordingly, the process for producing the wafer having the uneven pattern at its surface, conducted with use of the liquid chemical for forming a protective film according to the present invention, is excellent in productivity.

The liquid chemical for forming a protective film, according to the present invention is adaptable to uneven patterns having an aspect ratio expected to rise more and more in the future, for example, an aspect ratio of not less than 7, which allows cost reduction in producing more sophisticated semiconductor devices. In addition, the liquid chemical is adaptable without largely modifying conventional apparatuses and therefore results in being one applicable in production of various kinds of semiconductor devices.

MODE(S) FOR CARRYING OUT THE INVENTION

Figure 1:
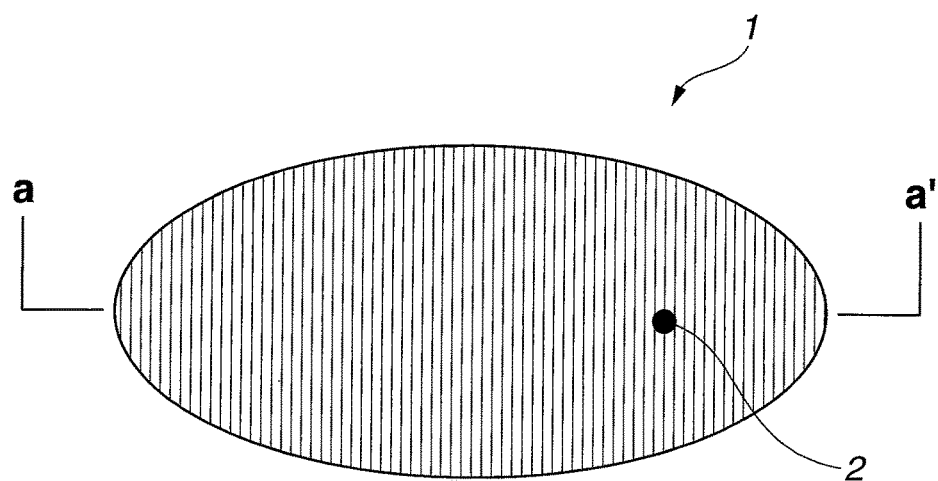
FIG. 1 A schematic perspective view of a wafer 1 the surface of which has an uneven pattern 2.

As a metal-based wafer, it is possible to cite: those obtained by coating a surface of a silicon wafer, a wafer formed of a plurality of components including silicon and/or silicon oxide ($SiO_2$), a silicon carbide wafer, a sapphire wafer, various compound semiconductor wafers, a plastic wafer or the like with a layer formed of a matter containing titanium element such as titanium, titanium nitride and titanium oxide, a matter containing tungsten element such as tungsten, tungsten oxide and the like, a matter containing aluminum element such as aluminum and aluminum oxide, a matter containing copper element such as copper and copper oxide, a matter containing tin element such as tin and tin oxide, a matter containing tantalum element such as tantalum nitride and tantalum oxide, or a matter containing ruthenium element such as ruthenium and ruthenium oxide; those in which at least one layer of a multilayer film formed on the wafer is a layer formed of a matter containing the above-mentioned metal-based elements; and the like. A step of forming the uneven pattern is conducted on a layer including a layer formed of the matter containing the above-mentioned metal-based elements. Additionally, those in which at least a part of the surfaces of the recessed portions serves as a matter containing at least one kind of the above-mentioned metal-based elements at the time of forming the uneven pattern are also included.

In general, pretreatment steps are performed previous to conducting a surface treatment using a liquid chemical for forming a protective film of the present invention. The pretreatment steps are exemplified as follows:

a pretreatment step 1 of making a wafer surface into a surface having an uneven pattern;

a pretreatment step 2 of cleaning the wafer surface by using a water-based cleaning liquid; and a pretreatment step 3 of substituting the water-based cleaning liquid with a cleaning liquid A different from the water-based cleaning liquid (hereinafter, sometimes referred to as merely "a cleaning liquid A").

Incidentally, either the pretreatment step 2 or the pretreatment step 3 may be skipped in some cases.

In the pretreatment step 1, a pattern is formed by a method as follows. First of all, a resist is applied to the wafer surface. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pressing a mold having a pattern onto the resist. Then, the wafer is subjected to etching. At this time, the parts of the wafer surface which parts correspond to recessed portions of a resist pattern are etched selectively. Finally, the resist is stripped off thereby obtaining a wafer having an uneven pattern.

By the above-mentioned pretreatment step 1, it becomes possible to obtain a wafer having at its surface an uneven pattern and containing at least one kind of element selected from the group consisting of titanium, tungsten, aluminum, copper, tin, tantalum and ruthenium at surfaces of recessed portions of the uneven pattern.

Examples of the water-based cleaning liquid used in the pretreatment step 2 are water, and an aqueous solution obtained by mixing at least one kind of an organic solvent, hydrogen peroxide, ozone, acid, alkali and surfactant with water (the aqueous solution having a water content of not less than 10 mass %, for example).

Furthermore, in the pretreatment step 2, substitution with the water-based cleaning liquid may be conducted twice or more. The water-based cleaning liquids to be used in this case may be different from each other.

Figure 2:
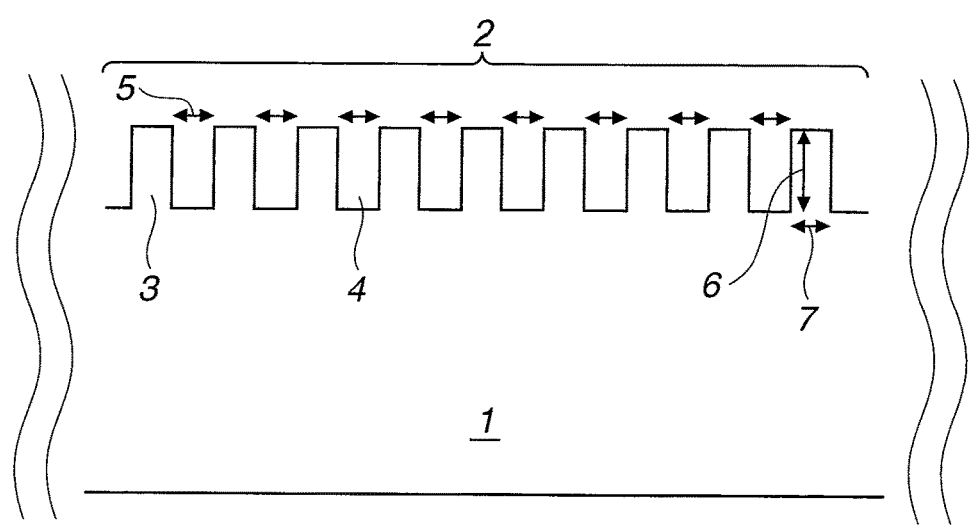
FIG. 2 A schematic view showing a part of a-a' cross section of FIG. 1.

If recessed portions have a small width and projected portions have a large aspect ratio, and if the surface is cleaned with the water-based cleaning liquid in the pretreatment step 2 and subsequently the water-based cleaning liquid is removed by drying and the like or if water is removed by drying and the like after substituting the water-based cleaning liquid with water, a pattern collapse is to easily occur. The uneven pattern is defined as shown in FIG. 1 and FIG. 2. FIG. 1 is one example of a schematic perspective view of a wafer 1 the surface of which has an uneven pattern 2. FIG. 2 shows a part of a-a' cross section of FIG. 1. A width 5 of recessed portions is defined by an interval between a projected portion 3 and a projected portion 3, as shown in FIG. 2. The aspect ratio of projected portions is expressed by dividing a height 6 of the projected portions by a width 7 of the projected portions. Pattern collapse in the cleaning step is to easily occur when the recessed portions have a width of not more than 70 nm, particularly not more than 45 nm and when the aspect ratio is not less than 4, particularly not less than 6.

The cleaning liquid A used in the pretreatment step 3 refers to an organic solvent, a mixture of the organic solvent and a water-based cleaning liquid, or a cleaning liquid into which at least one kind of acid, alkali and surfactant is mixed with these. Furthermore, it is preferable to carry out a step of retaining the liquid chemical for forming a protective film at least in the recessed portions of the uneven pattern (i.e. a protective film-forming step) by substituting the cleaning liquid A with the liquid chemical for forming a protective film of the present invention.

In the present invention, a style for cleaning the wafer is not particularly limited so long as the liquid chemical or the cleaning liquid can be retained at least in the recessed portions of the uneven pattern of the wafer. Examples of the style for cleaning the wafer are: a single cleaning style represented by spin cleaning where a generally horizontally held wafer is rotated and cleaned one by one while supplying a liquid to the vicinity of the center of the rotation; and a batch style where a plurality of wafer sheets are immersed in a cleaning bath to be cleaned. Incidentally, the form of the liquid chemical or the cleaning liquid at the time of supplying the liquid chemical or the cleaning liquid at least to the recessed portions of the uneven pattern of the wafer is not particularly limited as far as it is in a condition of liquid at time of being retained in the recessed portions, and is exemplified by liquid, vapor or the like.

The organic solvent, which is one preferable example of the cleaning liquid A, is exemplified by hydrocarbons, esters, ethers, ketones, halogen element-containing solvents, sulfoxide-based solvents, lactone-based solvents, carbonate-based solvents, alcohols, polyalcohol derivatives having OH group, polyalcohol derivatives having no OH group, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec 7100, Novec 7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of the lactone-based solvents are γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone and the like. Examples of the carbonate-based solvents are dimethyl carbonate, ethyl methyl carbonate, diethyl carbonate, propylene carbonate and the like. Examples of alcohols are methanol, ethanol, propanol, butanol, ethylene glycol, diethylene glycol, 1,2-propanediol, 1,3-propanediol, dipropylene glycol, 1,2-butanediol, 1,3-butanediol, 1,4-butanediol, triethylene glycol, tripropylene glycol, tetraethylene glycol, tetrapropylene glycol, glycerine and the like. Examples of the polyalcohol derivatives having OH group are ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, butylene glycol monomethyl ether and the like. Examples of the polyalcohol derivatives having no OH group are ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerine triacetate and the like. Examples of the nitrogen element-containing solvents are formamide, N,N-dimethylformamide, N,N-dimethylacetamide, N-methyl-2-pyrrolidone, diethylamine, triethylamine, pyridine and the like.

Incidentally, it is preferable that the cleaning liquid A is an organic solvent or a mixture liquid of water and an organic solvent in view of its cleanliness. Furthermore, it is preferable that the organic solvent contains a water-soluble organic solvent (a solubility in water is not smaller than 5 mass parts by mass relative to 100 parts by mass of water) because it can be easily substituted for the water-based cleaning liquid.

Additionally, in the pretreatment step 3, substitution with the cleaning liquid A may be conducted twice or more. More specifically, the water-based cleaning liquid used in the pretreatment step 2 may be substituted with a first kind of cleaning liquid A and then the first kind of cleaning liquid A may be substituted successively with two or more kinds of cleaning liquids A different from the above-mentioned cleaning liquid A, and finally it may be substituted with the liquid chemical for forming a protective film.

Moreover, in a case where the water-based cleaning liquid used in the pretreatment step 2 can be substituted directly with the liquid chemical for forming a protective film, substitution with the cleaning liquid A (the pretreatment step 3) may be omitted.

Figure 3:
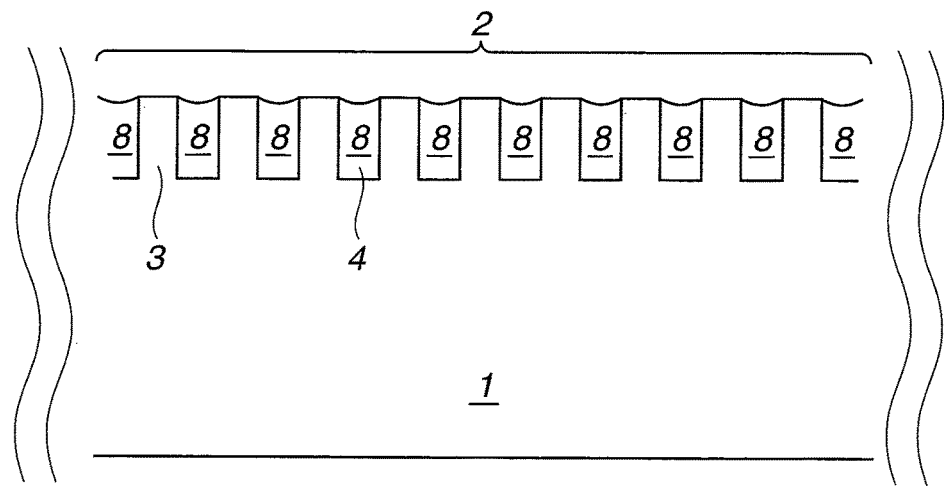
FIG. 3 A schematic view showing a condition where a liquid chemical 8 for forming a protective film is retained in recessed portions 4 in a cleaning step.

FIG. 3 is a schematic view showing a condition in which a liquid chemical 8 for forming a protective film is retained in recessed portions 4 in a protective film-forming step. The wafer of the schematic view of FIG. 3 shows a part of the a-a' cross section in FIG. 1. At this time, the protective film forming agent is adsorbed onto the surfaces of the recessed portions, thereby forming a protective film and imparting water repellency to the surfaces.

Incidentally, where the protective film can be formed by using the liquid chemical of the present invention is at least on a surface of a portion of a matter containing at least one kind of the metal-based elements, in the uneven pattern. Accordingly, the protective film may be such as to be formed at least on a part of the surfaces of the recessed portions of the metal-based wafer. Additionally, also in the case of a wafer formed of a plurality of components including the matter containing at least one kind of the above-mentioned metal-based elements, it is possible to form the protective film on the surface of the matter containing at least one kind of the above-mentioned metal-based elements. As examples of the wafer formed of a plurality of components, there are further included: those in which the matter containing at least one kind of the above-mentioned metal-based elements is formed at least at a part of the surfaces of the recessed portions; and those in which at least a part of the surfaces of the recessed portions is formed of the matter containing at least one kind of the above-mentioned metal-based elements at the time of forming the uneven pattern.

Incidentally, the liquid chemical for forming a protective film, according to the present invention can easily form an excellently water-repellent protective film on the surface of an article containing titanium element at its surface. Therefore, it is preferable that the wafer is a wafer having at its surface an uneven pattern and containing titanium element at the surfaces of the recessed portions of the uneven pattern.

The liquid chemical for forming a protective film is a liquid chemical containing a protective film forming agent and a solvent, for forming a protective film at least on the surfaces of the recessed portions subsequent to a step of cleaning the metal-based wafer and prior to a step of drying the same, wherein the water-repellent protective film forming agent is a compound represented by the general formula [1].

A hydrocarbon group contained in $R^2$ of the general formula [1] is exemplified by alkyl group, alkylene group and those the hydrogen elements of which may partially or entirely be replaced with a fluorine element(s).

Additionally, it is preferable that the above-mentioned $R^2$ is —$OR^4$ (where $R^4$ is a $C_1$-$C_{18}$ hydrocarbon group). Additionally, it is preferable that $R^4$ has a carbon number of 1 to 8, particularly 1 to 4, since a more excellent water repellency is imparted thereby. Moreover, $R^4$ is preferably a straight-chained alkyl group.

As the compound represented by the general formula [1], it is possible to cite $CH_3P(O)(OH)_2$, $C_2H_5P(O)(OH)_2$, $C_3H_7P(O)(OH)_2$, $C_4H_9P(O)(OH)_2$, $C_5H_{11}P(O)(OH)_2$, $C_6H_{13}P(O)(OH)_2$, $C_7H_{15}P(O)(OH)_2$, $C_8H_{17}P(O)(OH)_2$, $C_9H_{19}P(O)(OH)_2$, $C_{10}H_{21}P(O)(OH)_2$, $C_{11}H_{23}P(O)(OH)_2$, $C_{12}H_{25}P(O)(OH)_2$, $C_{13}H_{27}P(O)(OH)_2$, $C_{14}H_{29}P(O)(OH)_2$, $C_{15}H_{31}P(O)(OH)_2$, $C_{16}H_{33}P(O)(OH)_2$, $C_{17}H_{35}P(O)(OH)_2$, $C_{18}H_{37}P(O)(OH)_2$, $C_6H_5P(O)(OH)_2$, $CF_3P(O)(OH)_2$, $C_2F_5P(O)(OH)_2$, $C_3F_7P(O)(OH)_2$, $C_4F_9P(O)(OH)_2$, $C_5F_{11}P(O)(OH)_2$, $C_6F_{13}P(O)(OH)_2$, $C_7F_{15}P(O)(OH)_2$, $C_8F_{17}P(O)(OH)_2$, $CF_3C_2H_4P(O)(OH)_2$, $C_2F_5C_2H_4P(O)(OH)_2$, $C_3F_7C_2H_4P(O)(OH)_2$, $C_4F_9C_2H_4P(O)(OH)_2$, $C_5F_{11}C_2H_4P(O)(OH)_2$, $C_6F_{13}C_2H_4P(O)(OH)_2$, $C_7F_{15}C_2H_4P(O)(OH)_2$, $C_8F_{17}C_2H_4P(O)(OH)_2$, and compounds obtained by substituting —$P(O)(OH)_2$ group of the above compounds with —$P(O)(OH)OCH_3$ group, —$P(O)(OH)OC_2H_5$ group, —$P(O)(OCH_3)_2$ group or —$P(O)(OC_2H_5)_2$ group.

Furthermore, in order to impart a better water repellency, it is preferable that the protective film forming agent is a compound represented by the general formula [1] where "a" is 1 or 2, more preferably a compound represented by the general formula [2] where "a" is 2.

Examples of $R^1$ and $R^3$ of the general formulas [1] and [2] are: alkyl group; phenyl group; phenyl group the hydrogen element of which is substituted with alkyl group; naphthyl group; these hydrocarbon groups whose hydrogen elements are partially or entirely substituted with a fluorine element(s); and the like.

Moreover, it is preferable that $R^1$ and $R^3$ of the general formulas [1] and [2] have a carbon number of 2 to 16, particularly preferably 4 to 14 and much more preferably 6 to 14, since a more excellent water repellency is imparted thereby. Additionally, the hydrocarbon group the hydrogen elements of which may partially or entirely be substituted with a fluorine element(s) is preferably alkyl group and particularly preferably a straight-chained alkyl group. If the hydrocarbon group is a straight-chained alkyl group, hydrophobic moieties of the protective film forming agent tend to be arranged perpendicularly to the surface of the protective film at the time of forming the protective film so as to enhance the water repellency-imparting effect, which is therefore further preferable. Moreover, $R^1$ and $R^3$ of the general formulas [1] and [2] bring about a far better water repellency, so that these are preferably hydrocarbon groups whose hydrogen elements are partially or entirely be substituted with a fluorine element(s).

The protective film forming agent may exist in the form of a salt of the compound represented by the general formulas [1] and [2], such as ammonium salt, amine salt and the like.

The solvent used in the liquid chemical for forming a protective film contains an alcohol having a carbon number of 6 or less; water; or both of the alcohol and water, in which the total concentration of the alcohol and water is 0.8 to 100 mass % relative to the total amount of 100 mass % of the solvent. In addition to the alcohol having a carbon number of 6 or less and water, it is also possible to use hydrocarbons, esters, ethers, ketones, halogen element-containing solvents, sulfoxide-based solvents, lactone-based solvents, carbonate-based solvents, alcohols having a carbon number of 7 or more, polyalcohol derivatives having no OH group, nitrogen element-containing solvents, or a mixture liquid of these, as the solvent for the liquid chemical for forming a protective film.

As an example of the alcohol having a carbon number of 6 or less, not only methanol, ethanol, propanol, butanol, pentanol and hexanol but also polyalcohols and polyalcohol derivatives having OH group can also be cited. Examples of the polyalcohols are ethylene glycol, diethylene glycol, 1,2-propanediol, 1,3-propanediol, 1,2-butanediol, 1,3-butanediol, 1,4-butanediol, glycerine and the like. Examples of the polyalcohol derivatives having OH group are ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, butylene glycol monomethyl ether, diethylene glycol monomethyl ether, diethylene glycol monoethyl ether, dipropylene glycol, triethylene glycol and the like. Among these, it is preferable to employ an alcohol having one OH group, more preferably an alcohol having a carbon number of 4 or less because the protective film forming agent has good solubility. Methanol, ethanol and propanol are particularly preferable since the protective film forming agent has better solubility. Propanol is much more preferable in consideration of its price and toxicity.

However, when an alcohol having a carbon number of 6 or less is contained, the water repellency-imparting effect of the liquid chemical for forming a protective film tends to decrease. Accordingly, the concentration of the alcohol having a carbon number of 6 or less is preferably 0.05 to 60 mass % relative to the total amount of 100 mass % of the solvent for the liquid chemical for forming a protective film.

Additionally, when the liquid chemical for forming a protective film contains water, the liquid chemical for forming a protective film becomes nonflammable or increases in flash point, thereby reducing the risk of the liquid chemical.

Hence the liquid chemical for forming a protective film preferably contains an alcohol having a carbon number of 6 or less and water, particularly preferably propanol and water. It is industrially preferable to use a solvent containing propanol and water because of its easiness of acquisition.

A solvent other than an alcohol having a carbon number of 6 or less and water (hereinafter, sometimes referred to as merely "other solvent"), which may sometimes be used in the liquid chemical for forming a protective film, is exemplified by hydrocarbons, esters, ethers, ketones, halogen element-containing solvents, sulfoxide-based solvents, lactone-based solvents, carbonate-based solvents, polyalcohol derivatives having no OH group and nitrogen element-containing solvents. Concrete examples thereof are the same organic solvents usable for the cleaning liquid A.

Of the above-mentioned other solvents, an alcohol having a carbon number of 7 or more is exemplified by octanol, heptanol, tripropylene glycol, tetraethylene glycol, tetrapropylene glycol, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether and the like.

It is preferable in view of safety under the fire protection law to use a solvent having a flash point exceeding 70° C. as the above-mentioned other solvents.

According to "Globally Harmonized System of Classification and Labelling of Chemicals; GHS", a solvent having a flash point of not higher than 93° C. is defined as "a flammable liquid". Therefore, when a solvent having a flash point exceeding 93° C. is used as the above-mentioned other solvent, the liquid chemical for forming a protective film tends to have a flash point exceeding 93° C. even if the solvent is not nonflammable one. Such a liquid chemical hardly corresponds to "a flammable liquid" and therefore further preferable in view of safety.

Most of the lactone-based solvents, the carbonate-based solvents, alcohols having a large molecular weight or two or more OH groups and the polyalcohol derivatives have high flash point so as to be preferably used as the above-mentioned other solvents because the risk of the liquid chemical for forming a protective film can be lowered. From the viewpoint of safety, a solvent having a flash point exceeding 70° C. is more preferably used as the above-mentioned other solvent, which is concretely exemplified by γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, heptanol, octanol, tripropylene glycol, tetraethylene glycol, tetrapropylene glycol, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, ethylene glycol dibutyl ether, ethylene glycol monobutyl ether acetate, ethylene glycol diacetate, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol methyl propyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like. Furthermore, a solvent having a flash point exceeding 93° C. is much more preferably used as the above-mentioned other solvent, which is concretely exemplified by γ-butyrolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, ε-hexanolactone, propylene carbonate, tripropylene glycol, tetraethylene glycol, tetrapropylene glycol, glycerine, diethylene glycol monopropyl ether, diethylene glycol monobutyl ether, triethylene glycol monomethyl ether, triethylene glycol monoethyl ether, triethylene glycol monopropyl ether, triethylene glycol monobutyl ether, tetraethylene glycol monomethyl ether, tetraethylene glycol monoethyl ether, tetraethylene glycol monopropyl ether, tetraethylene glycol monobutyl ether, dipropylene glycol monopropyl ether, dipropylene glycol monobutyl ether, tripropylene glycol monomethyl ether, tripropylene glycol monoethyl ether, tripropylene glycol monopropyl ether, tripropylene glycol monobutyl ether, tetrapropylene glycol monomethyl ether, ethylene glycol diacetate, diethylene glycol butyl methyl ether, diethylene glycol dibutyl ether, diethylene glycol diacetate, diethylene glycol monomethyl ether acetate, diethylene glycol monoethyl ether acetate, diethylene glycol monobutyl ether acetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol diacetate, dipropylene glycol monomethyl ether acetate, dipropylene glycol monoethyl ether acetate, dipropylene glycol monobutyl ether acetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerine triacetate and the like.

Moreover, from the reason that far excellent water repellency can be obtained, it is preferable that the above-mentioned other solvent is selected from hydrocarbons, esters, ethers, ketones, lactone-based solvents, carbonate-based solvents, polyalcohol derivatives having no OH group and a mixture of these. Additionally, in consideration of the substitutability with a cleaning liquid (a water-based cleaning liquid in particular) and the solubility of water to be used in the liquid chemical for forming a protective film, it is preferable that the above-mentioned other solvent to be added to the liquid chemical is a polyalcohol derivative having no OH group which has good solubility in water.

A method of producing a liquid chemical for forming a water-repellent protective film, according to the present invention is a method of mixing a solvent that contains an alcohol having a carbon number of 6 or less and/or water with a water-repellent protective film forming agent thereby obtaining the liquid chemical for forming a water-repellent protective film, in which the order of mixing various solvents with the water-repellent protective film forming agent is not demanded.

In the method of producing a liquid chemical for forming a water-repellent protective film, the liquid chemical for forming a water-repellent protective film is obtained preferably by mixing a solution where the water-repellent protective film forming agent is dissolved in an alcohol having a carbon number of 6 or less with a solvent that contains an alcohol having a carbon number of 6 or less and/or water. It is preferable to previously prepare the solution where the water-repellent protective film forming agent is dissolved in an alcohol having a carbon number of 6 or less since an uniform liquid chemical for forming a water-repellent protective film can easily be obtained by mixing the solution with the solvent that contains an alcohol having a carbon number of 6 or less and/or water. Similarly, also in the case of previously preparing a solution where the water-repellent protective film forming agent is dissolved in a solvent containing an alcohol having a carbon number of 6 or less, an uniform liquid chemical for forming a water-repellent protective film can easily be obtained by mixing the solution with the solvent that contains an alcohol having a carbon number of 6 or less and/or water. It is more preferable to use an alcohol having a carbon number of 6 or less alone at the time of previously dissolving the water-repellent protective film forming agent because the agent can be dissolved in a short time.

In order to accelerate the formation of the protective film from the protective film forming agent, a catalyst may be added to the liquid chemical for forming a protective film. The amount of the catalyst to be added is preferably 0.01 to 50 mass % relative to the total amount of 100 mass % of the protective film forming agent.

When increasing the temperature of the liquid chemical for forming a protective film, it becomes possible to easily form the protective film in a shorter time. A temperature at which a uniform protective film can readily be formed is not lower than 10° C. and lower than the boiling point of the liquid chemical. Particularly, it is preferable to keep a temperature of not lower than 15° C. and not higher than a temperature 10° C. lower than the boiling point of the liquid chemical. It is preferable that the temperature of the liquid chemical is kept at the above-mentioned temperature the liquid chemical being retained at least in the recessed portions of the uneven pattern. Incidentally, the boiling point of the liquid chemical refers to the boiling point of a component having the largest amount by mass among components contained in the liquid chemical for forming a protective film.

After the protective film-forming step, the liquid chemical retained at least in the recessed portions of the uneven pattern may be substituted with a cleaning liquid different from the above-mentioned liquid chemical (hereinafter, this cleaning liquid different from the above-mentioned liquid chemical is sometimes referred to as "a cleaning liquid B") (hereinafter, this step is sometimes referred to as "a subsequent cleaning step"), and then it may be brought into a drying step. Examples of the cleaning liquid B are: a water-based cleaning liquid; an organic solvent; a mixture of the water-based cleaning liquid and the organic solvent; those into which at least one kind of acid, alkali and a surfactant is mixed; these in which the protective film forming agent used for the liquid chemical for forming a protective film is contained at a concentration lower than that of the liquid chemical; and the like. From the viewpoint of removing particles and metal impurities, it is more preferable that the cleaning liquid B is water, an organic solvent or a mixture of water and the organic solvent.

Furthermore, in the subsequent cleaning step, substitution with the cleaning liquid B may be conducted twice or more. More specifically, the liquid chemical for forming a protective film may be substituted with a first kind of cleaning liquid B and then the first kind of cleaning liquid B may be substituted successively with two or more kinds of cleaning liquids B different from the above-mentioned cleaning liquid B, followed by the drying step.

The organic solvent, which is one preferable example of the cleaning liquid B, is exemplified by hydrocarbons, esters, ethers, ketones, halogen element-containing solvents, sulfoxide-based solvents, alcohols, polyalcohol derivatives, nitrogen element-containing solvents and the like.

Concrete examples of the organic solvent are the same as those usable for the cleaning liquid A or the liquid chemical for forming a protective film.

If an organic solvent is used as the cleaning liquid B, a protective film formed on the wafer surface by the liquid chemical of the present invention tends to hardly be reduced in terms of water repellency even after the subsequent cleaning step.

Figure 4:
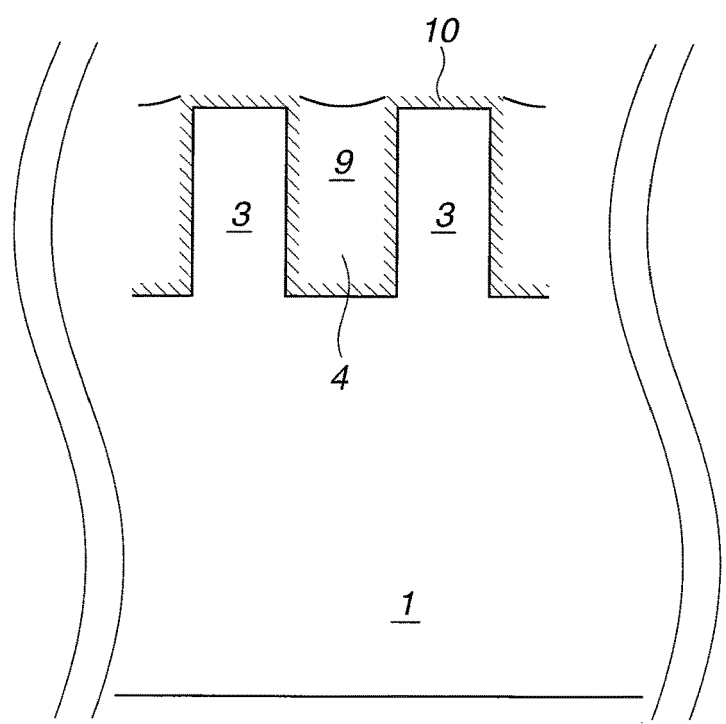
FIG. 4 A schematic view showing a condition where liquid is retained in the recessed portions 4 on which a protective film is formed.

FIG. 4 is a schematic view showing a condition in which liquid is retained in recessed portions 4 that had been provided with water repellency by the liquid chemical for forming a protective film. The wafer of the schematic view of FIG. 4 shows a part of the a-a' cross section in FIG. 1. On the surface of the uneven pattern, a protective film 10 is formed by the liquid chemical, so that water repellency is imparted to the surface. The protective film 10 is held on the wafer surface even after liquid 9 is removed from the uneven pattern.

When the protective film 10 is formed at least on the surfaces of the recessed portions of the uneven pattern of the wafer by the liquid chemical for forming a protective film, the contact angle on the assumption that water is retained on the surfaces is preferably 60 to 120°, because pattern collapse becomes difficult to occur thereby. The contact angle is more preferably 70 to 110°, much more preferably 75 to 105°, because a contact angle closer to 90° makes capillary force (that acts on the recessed portions) smaller so as to get pattern collapse more difficult to occur. Moreover, the capillary force on the assumption that water is retained on the surfaces is preferably not higher than 1.6 $MN/m^2$. A capillary force of not higher than 1.6 MN/m² is preferable because pattern collapse becomes difficult to occur. Since pattern collapse becomes more difficult to occur with decrease in capillary force, the capillary force is more preferably not higher than 1.1 MN/m², much more preferably not higher than 0.9 MN/m². Furthermore, it is ideal to put the capillary force close to 0.0 MN/m² as much as possible by adjusting the contact angle to the liquid to around 90°.

Then, as discussed in the drying step, there is conducted a step of removing a liquid from the uneven pattern by drying, the liquid having been retained in the recessed portions 4 on which the protective film is formed by the liquid chemical. At this time, the liquid retained in the recessed portions may be the liquid chemical used in the protective film-forming step, the cleaning liquid B used in the subsequent cleaning step, or a mixture liquid of these. The mixture liquid is one in which the protective film forming agent is contained in the liquid chemical for forming a protective film at a concentration lower than that of the liquid chemical, and the mixture liquid may be a liquid which is on the way to substitution of the liquid chemical with the cleaning liquid B, or a mixture liquid obtained by previously mixing the protective film forming agent with the cleaning liquid B. In view of the cleanliness of the wafer, there is particularly preferably used water, an organic solvent, or a mixture of water and the organic solvent. Additionally, it is also possible to bring the cleaning liquid B retained on the unevenly patterned surface after once removing liquid from the unevenly patterned surface, followed by drying.

Incidentally, in a case of performing a cleaning treatment after a surface treatment with the liquid chemical (i.e. in a case of performing a subsequent cleaning step), a time for this step, i.e. a time to retain the cleaning liquid B is preferably not shorter than 10 seconds, more preferably not shorter than 20 seconds from the viewpoint of removing particles and impurities from the unevenly patterned surface. If an organic solvent is used as the cleaning liquid B, the water repellency of the wafer surface tends to easily be maintained even after conducting the subsequent cleaning step, in view of the effect of maintaining a water repellent performance of the protective film formed on the unevenly patterned surface. On the other hand, if the time for the subsequent cleaning step is too long, the productivity is so lowered; therefore the time of the subsequent cleaning step is preferably within 15 minutes.

In the drying step, a liquid retained on the uneven pattern is removed by drying. The drying is conducted preferably by a conventionally known drying method such as spin drying, IPA (2-propanol) steam drying, Marangoni drying, heating drying, warm air drying, blowing drying, vacuum drying and the like.

Then, as discussed in the film removal step, there is performed a step of removing the protective film 10. In the case of removing the water-repellent protective film, it is effective to cleave C—C bond and C—F bond in the water-repellent protective film. A method therefor is not particularly limited so long as it is possible to cleave the above-mentioned bonds but exemplified by: irradiating the wafer surface with light; heating the wafer; exposing the wafer to ozone; irradiating the wafer surface with plasma; subjecting the wafer surface to corona discharge; and the like.

In the case of removing the protective film 10 by light irradiation, it is preferable to conduct an irradiation with ultraviolet rays having a wavelength of shorter than 340 nm and 240 nm (corresponding to bond energies of C—C bond and C—F bond in the protective film 10, i.e., 83 kcal/mol and 116 kcal/mol, respectively). As the light source therefor, there is used a metal halide lamp, a low-pressure mercury lamp, a high-pressure mercury lamp, an excimer lamp, a carbon arc or the like. In the case of the metal halide lamp, the intensity of the ultraviolet irradiation is preferably not less than 100 mW/cm², particularly preferably not less than 200 mW/cm², as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 mW/cm² takes a long time to remove the protective film 10. Additionally, in the case of the low-pressure mercury lamp, the ultraviolet irradiation is to be performed with shorter wavelengths so that removal of the protective film 10 is achieved in a short time even if the intensity is low, which is therefore preferable.

Additionally, in the case of removing the protective film 10 by light irradiation, it is particularly preferable to generate ozone while decomposing the components of the protective film 10 by ultraviolet rays and then to induce oxidation-volatilization of the components of the protective film 10 by the ozone, since a treatment time is saved thereby. As the light source therefor, the low-pressure mercury lamp, the excimer lamp or the like is used. Moreover, the wafer may be heated while being subjected to light irradiation.

In the case of heating the wafer, heating of the wafer is conducted at 400 to 1000° C., preferably at 500 to 900° C. The heating time is preferably kept from 10 seconds to 60 minutes, more preferably from 30 seconds to 10 minutes. Additionally, this step may be conducted in combination with ozone exposure, plasma irradiation, corona discharge or the like. Furthermore, the light irradiation may be conducted while heating the wafer.

As the method for removing the protective film 10 by heating, there are a method of bringing a wafer into contact with a heat source, a method of bringing a wafer into a heated atmosphere such as a heat treatment furnace, and the like. The method of bringing a wafer into a heated atmosphere can easily and uniformly provide the wafer surface with energy for removing the protective film 10 even in a case of conducting a treatment on two or more wafers. This method is operationally convenient, achieves the treatment within a short period of time and excellent in treatment ability. Therefore, this is an industrially advantageous method.

In the case of exposing the wafer to ozone, it is preferable to expose the wafer surface to ozone generated by ultraviolet irradiation using the low-pressure mercury lamp, low-temperature discharge using high voltages or the like. The wafer may be irradiated with light or heated while being exposed to ozone.

In the film removal step, the protective film formed on the wafer surface can efficiently be removed by combining the above-mentioned light irradiation, heating, ozone exposure, plasma irradiation, corona discharge and the like.

EXAMPLES

A technique of making a wafer surface into a surface having an uneven pattern and a technique of substituting a cleaning liquid retained at least in recessed portions of the uneven pattern with other cleaning liquid have been variously studied as discussed in other literatures and the like, and therefore such techniques have already been established.

Accordingly, in the present invention, evaluations of a liquid chemical for forming a protective film were mainly performed. It is apparent from the following equation that pattern collapse greatly depends on the contact angle of a cleaning liquid to the wafer surface, i.e. on the contact angle of a liquid drop and on the surface tension of the cleaning liquid.

$$P = 2 \times \gamma \times \cos\theta / S$$

(In the equation, γ represents the surface tension of liquid retained in the recessed portions, θ represents the contact angle of the liquid retained in the recessed portions to the surfaces of the recessed portions, and S represents the width of the recessed portions.)

In a case of a cleaning liquid retained in recessed portions 4 of an uneven pattern 2, the contact angle of a liquid drop and the capillary force acting on the recessed portions (which force is regarded as being equal to pattern collapse) are in correlation with each other, so that it is also possible to derive the capillary force from the equation and the evaluations made on the contact angle of the liquid drop to a protective film 10. In Examples, water, which is representative of a water-based cleaning liquid, was used as the cleaning liquid.

However, in the case of a wafer having an unevenly patterned surface, it is not possible to exactly evaluate the contact angle of the protective film 10 itself, the protective film 10 being formed on the unevenly patterned surface.

An evaluation of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused so that an apparent contact angle of the waterdrop is increased under the influence of a surface shape (roughness) of the substrate upon the contact angle.

In view of the above, in Examples of the present invention, various kinds of evaluations were carried out in such a manner as to supply the liquid chemical onto a wafer having a smooth surface to form a protective film on the wafer surface. The protective film was referred to as a protective film 10 formed on a surface of a wafer 1 having at its surface an uneven pattern 2. In Examples of the present invention, there were used "a wafer having a titanium nitride film" (indicated by "TiN" in Table) obtained by forming a titanium nitride layer on a silicon wafer having a smooth surface and "a wafer having a ruthenium film" (indicated by "Ru" in Table) obtained by forming a ruthenium layer on a silicon wafer having a smooth surface.

Details will be discussed below. Hereinafter, there will be discussed: a method for evaluating a liquid chemical for forming a protective film and a wafer to which the liquid chemical for forming a protective film is supplied; preparation of the liquid chemical for forming a protective film; and results of evaluation made after supplying the liquid chemical for forming a protective film to the wafer.

[Method for Evaluating Liquid Chemical for Forming Protective Film and Wafer to which Liquid Chemical for Forming Protective Film is Provided]

As a method for evaluating a liquid chemical for forming a protective film and a wafer to which the liquid chemical for forming a protective film is supplied, the following evaluations (1) to (6) were performed.

(1) Solubility of Water-Repellent Protective Film Forming Agent

After mixing the raw materials, the appearance of the liquid chemical was visually observed 1 minute and 1 hour after stirring at room temperature (25° C.), from which it was confirmed whether the water-repellent protective film forming agent was dissolved or not. A liquid chemical that dissolved the agent within 1 hour after stirring was classified as an acceptable one (indicated by "○" in Table), and additionally a liquid chemical dissolved the agent within 1 minute after stirring was classified as one having a particularly good solubility (indicated by "⊚" in Table). Meanwhile, a liquid chemical that could not dissolve the agent within 1 hour after stirring was classified as an unacceptable one (indicated by "x" in Table). In Table, a time required to dissolve the agent is also indicated as "Dissolution Time". In the case of previously dissolving the water-repellent protective film forming agent in a solvent (hereinafter, sometimes referred to as "a first solvent") to obtain a solution and then mixing the solution with another solvent (hereinafter, sometimes referred to as "a second solvent") to prepare a liquid chemical, the dissolution time means a time required to dissolve the water-repellent protective film forming agent in the second solvent. Meanwhile, in the case of mixing the water-repellent protective film forming agent with all the solvents at the same time, the dissolution time means a time required to dissolve the water-repellent protective film forming agent in all of the solvents (In Table, the kind of the solvent is indicated only in the "First Solvent" column).

(2) Storage Stability of Liquid Chemical for Forming Protective Film at Low Temperatures (Evaluation on Presence of Solid Matter in Liquid Chemical)

The appearance of the liquid chemical for forming a protective film was visually observed, after cooling the liquid chemical to 0° C. or −30° C. for 24 hours and then bringing it back to room temperature (25° C.). A liquid chemical in which precipitation of a solid matter was not detected and a condition of a uniform solution was kept was classified as an acceptable one (indicated by "○" in Table), while a liquid chemical in which precipitation of a solid matter was detected as an unacceptable one (indicated by "x" in Table).

(3) Evaluation of Contact Angle of Protective Film Formed on Wafer Surface

About 2 μl of pure water was dropped on a surface of a wafer on which a protective film was formed, followed by measuring an angle (contact angle) formed between the waterdrop and the wafer surface by using a contact angle meter (produced by Kyowa Interface Science Co., Ltd.: CA-X Model). In this evaluation, a protective film confirmed to have a contact angle within a range of from 60 to 120° was classified as an acceptable one.

(4) Evaluation of Capillary Force

The capillary force (the absolute value of P) was obtained by calculating P by using the following equation.

$$P = 2 \times \gamma \times \cos\theta / S$$

(In the equation, γ represents the surface tension of liquid retained in the recessed portions, θ represents the contact angle of the liquid retained in the recessed portions to the surfaces of the recessed portions, and S represents the width of the recessed portions.)

Incidentally, the present example was made on the assumption that a wafer was formed having a line-and-space pattern the line width (the width of the recessed portions) of which was 45 nm, as an example of a pattern shape. The pattern having a line width of 45 nm tends to cause its collapse in a case where a cleaning liquid used when a gas-liquid interface passes through the uneven pattern is water, while pattern collapse tends to be difficult to occur in a case of 2-propanol. If the wafer surface is provided to contain titanium nitride or ruthenium, for example, the contact angle of 2-propanol to the surface is 0.5° in either case, and similarly the contact angle of water is 2° in either case. Also concerning the other matters containing titanium element or ruthenium element (such as titanium, titanium oxide and ruthenium oxide), the degree of the contact angle is as much as the above. In a case where the pattern width is 45 nm and the wafer surface is provided to contain titanium nitride (a wafer having a titanium nitride film) or ruthenium (a wafer having a ruthenium film) and where the cleaning liquid is 2-propanol (the surface tension of which is 22 mN/m), the capillary force is 0.98 MN/m². On the other hand, in a case of water (the surface tension of which is 72 mN/m) having the largest surface tension among liquids other than mercury, the capillary force results in 3.2 MN/m².

(5) Removability of Protective Film

Under the following conditions, a sample was irradiated with UV rays from a metal halide lamp for 2 hours, upon which an evaluation of removability of the protective film at the film removal step was made. A sample on which water-drop had a contact angle of not larger than 30° after the irradiation was classified as acceptable one.

Lamp: M015-L312 produced by EYE GRAPHICS CO., LTD. (Intensity: 1.5 kW)
Illuminance: 128 mW/cm² as a measurement value obtained under the following conditions
Measuring Apparatus: Ultraviolet Intensity Meter (UM-10 produced by Konica Minolta Sensing, Inc.)
Light-Receptor: UM-360 (Light-Receptive Wavelength: 310-400 nm, Peak Wavelength: 365 nm)
Measuring Mode: Irradiance Measurement (6) Evaluation of Surface Smoothness of Wafer after Removing Protective Film The surface was observed by atomic force microscope (produced by Seiko Instruments Inc.: SPI3700, 2.5 micrometer square scan). Then, there was obtained a difference ΔRa (nm) in the centerline average surface roughness Ra (nm) of the surface of the wafer between before and after the cleaning. Incidentally, Ra is a three-dimensionally enlarged one obtained by applying the centerline average roughness defined by JIS B 0601 to a measured surface and is calculated as "an average value of absolute values of deviation from standard surface to designated surface" from the following equation.

$$Ra = \frac{1}{S_0} \int_{Y_T}^{Y_B} \int_{X_L}^{X_R} |F(X, Y) - Z_0| dXdY$$

where $X_L$ and $X_R$, and $Y_B$ and $Y_T$ represent a measuring range in the X coordinate and the Y coordinate, respectively. $S_0$ represents an area on the assumption that the measured surface is ideally flat, and is a value obtained by $(X_R-X_L) \times (Y_B-Y_T)$. Additionally, $F(X,Y)$ represents the height at a measured point $(X,Y)$. $Z_0$ represents the average height within the measured surface.

The Ra value of the wafer surface before the protective film was formed thereon and the Ra value of the wafer surface after the protective film was removed therefrom were measured. If a difference between them (ΔRa) was within ±1 nm, the wafer surface was regarded as not being eroded by the cleaning and not leaving residues of the protective film thereon, and therefore classified as an acceptable one.

Example 1

(I-1) Preparation of Liquid Chemical for Forming Protective Film

A mixture of: 0.1 g of perfluorohexylethylphosphonic acid $[C_6F_{13}C_2H_4P(O)(OH)_2]$ that serves as a water-repellent protective film forming agent; and 0.2 g of isopropyl alcohol (hereinafter, referred to as "iPA") was stirred at 25° C. to dissolve it. The thus obtained solution was mixed with 99.8 g of a solvent obtained by combining diethylene glycol monoethyl ether acetate (hereinafter, referred to as "DGEEA") and water at a mass ratio of 94.8:5, with which the water-repellent protective film forming agent was dissolved within 1 minute and a uniform, clear, colorless solution was obtained. The solution was stirred for an additional 1 hour, thereby obtaining a liquid chemical for forming a protective film which liquid chemical had the concentration of the protective film forming agent (hereinafter referred to as "a protective film forming agent concentration") of 0.1 mass % relative to the total amount of the liquid chemical for forming a protective film. Additionally, the appearance of the liquid chemical was visually observed, after cooling the liquid chemical to 0° C. or −30° C. for 24 hours and then bringing it back to room temperature (25° C.). As a result, the liquid chemical kept a condition of the uniform, clear, colorless solution even after being stored at 0° C. and precipitation of a solid matter was not detected in the liquid chemical, from which it was confirmed that the storage stability at low temperatures was excellently exhibited. Furthermore, precipitation of a solid matter was also not detected in the liquid chemical even after storing the liquid chemical at −30° C., from which it was confirmed that the storage stability at low temperatures was enormously excellently exhibited.

(I-2) Wafer Cleaning Step (Pretreatment Step)

As a pretreatment step 2, a wafer having a smooth titanium nitride film (a silicon wafer formed having on its surface a titanium nitride layer of 50 nm thickness) was immersed in 1 mass % hydrogen peroxide for 1 minute at room temperature, and then immersed in pure water for 1 minute. Furthermore, as a pretreatment step 3, the wafer was immersed in iPA for 1 minute.

(I-3) from Step of Forming Protective Film on Wafer to Drying Step

In a protective film-forming step, the wafer having a titanium nitride film was immersed in the liquid chemical for forming a protective film which liquid chemical had been prepared according to the "(I-1) Preparation of Liquid Chemical for forming Protective Film" section, for 1 minute at 25° C., thereby causing adsorption of a protective film forming agent to form a protective film on the wafer surface. Thereafter the wafer was taken out of the liquid chemical for forming a protective film. Then, a subsequent cleaning step was conducted in such a manner as to immerse the wafer having a titanium nitride film in pure water serving as a cleaning liquid B for 1 minute. In a drying step, the wafer having a titanium nitride film was taken out of pure water, followed by blowing air to remove the pure water from the surface.

As a result of evaluating the thus obtained wafer having a titanium nitride film in a manner discussed in the above [Method for Evaluating Wafer to which Liquid Chemical for forming Protective Film is provided] section, a wafer having an initial contact angle of smaller than 10° before the surface treatment was confirmed to have a contact angle of 92° after the surface treatment, as shown in Table 1, from which it was confirmed that the water repellency-imparting effect was excellently obtained. Additionally, as a result of calculating the capillary force (in the case where water was retained) from the equation discussed in the above [Evaluation of Capillary Force] section, the capillary force was so small as to be 0.1 $MN/m^2$. Moreover, the contact angle after UV irradiation was smaller than 10°, which means that removal of the protective film was achieved. Furthermore, the ΔRa value of the wafer after LTV irradiation was within ±0.5 nm, with which it was confirmed that the wafer was not eroded at the time of cleaning and that residues of the protective film did not remain after LTV irradiation.

TABLE 1

| | Liquid Chemical for Forming Protective Film | | | | | | | |
|---|---|---|---|---|---|---|---|---|
| | | Protective Film Forming Agent Concentration [mass %] | Solvent | | | | Order of Producing Liquid Chemical for forming Protective Film | |
| | Protective Film Forming Agent | | Kind | Concentration in Solvent [mass %] | | | | |
| | | | | Water | Alcohol having Number of 6 or less Carbon | Other Solvent | First Solvent | Second Solvent |
| Example 1 | $C_6F_{13}$—$C_2H_4$—$P(O)(OH)_2$ | 0.1 | Water/iPA/DGEEA | 5 | 0.2 | 94.8 | iPA | Water/DGEEA |
| Example 2 | $C_6F_{13}$—$C_2H_4$—$P(O)(OH)_2$ | 0.5 | Water/iPA/DGEEA | 5 | 1 | 94 | iPA | Water/DGEEA |
| Example 3 | $C_6F_{13}$—$C_2H_4$—$P(O)(OH)_2$ | 0.1 | Water/iPA/DGEEA | 5 | 10 | 85 | iPA | Water/DGEEA |
| Example 4 | $C_6F_{13}$—$C_2H_4$—$P(O)(OH)_2$ | 0.1 | Water/PGME/DGEEA | 5 | 10 | 85 | PGME | Water/DGEEA |
| Example 5 | $C_6F_{13}$—$C_2H_4$—$P(O)(OH)_2$ | 0.1 | Water/iPA/DGEEA | 10 | 0.2 | 89.8 | iPA | Water/DGEEA |
| Example 6 | $C_6F_{13}$—$C_2H_4$—$P(O)(OH)_2$ | 0.1 | Water/iPA/DGEEA | 0.7 | 0.1 | 92.9 | iPA | Water/DGEEA |
| Example 7 | $C_6F_{13}$—$C_2H_4$—$P(O)(OH)_2$ | 0.1 | Water/iPA/DGEEA | 1 | 0.1 | 89.9 | iPA | Water/DGEEA |
| Example 8 | $C_6F_{13}$—$C_2H_4$—$P(O)(OH)_2$ | 0.1 | Water/iPA/DGEEA | 0.5 | 5 | 94.5 | iPA | Water/DGEEA |
| Example 9 | $C_6F_{13}$—$C_2H_4$—$P(O)(OH)_2$ | 0.1 | Water/DGEEA | 5 | 0 | 95 | Water/DGEAA | — |
| Example 10 | $C_6F_{13}$—$C_2H_4$—$P(O)(OH)_2$ | 0.1 | iPA/DGEEA | 0 | 5 | 95 | iPA/DGEAA | — |
| Example 11 | $C_6F_{13}$—$C_2H_4$—$P(O)(OH)_2$ | 0.1 | iPA/DGEEA | 1 | 70 | 29 | iPA/DGEEA | — |
| Example 12 | $C_6F_{13}$—$C_2H_4$—$P(O)(OH)_2$ | 0.1 | Water/iPA/DGEEA | 5 | 0.2 | 94.8 | Water/iPA/DGEEA | — |
| Example 13 | $C_6F_{13}$—$C_2H_4$—$P(O)(OH)_2$ | 0.1 | Water/iPA | 70 | 30 | 0 | iPA | Water |
| Example 14 | $C_6F_{13}$—$C_2H_4$—$P(O)(OH)_2$ | 0.5 | Water/iPA | 70 | 30 | 0 | iPA | Water |
| Example 15 | $C_6F_{13}$—$C_2H_4$—$P(O)(OH)_2$ | 1 | Water/iPA | 70 | 30 | 0 | iPA | Water |
| Example 16 | $C_6F_{13}$—$C_2H_4$—$P(O)(OH)_2$ | 0.1 | Water/iPA/DPGMEA | 1 | 0.2 | 98.8 | iPA | Water/DPGMEA |
| Example 17 | $C_6F_{13}$—$C_2H_4$—$P(O)(OH)_2$ | 0.1 | Water/DPGMEA | 1 | 0 | 99 | Water/DPGMEA | — |
| Example 18 | $C_6F_{13}$—$C_2H_4$—$P(O)(OH)_2$ | 0.1 | Water/iPA/PGMEA | 1 | 0.2 | 98.8 | iPA | Water/PGMEA |
| Example 19 | $C_6F_{13}$—$C_2H_4$—$P(O)(OH)_2$ | 0.1 | Water/PGMEA | 1 | 0 | 99 | Water/PGMEA | — |
| Example 20 | $C_6F_{13}$—$C_2H_4$—$P(O)(OH)_2$ | 0.1 | Water/iPA/DGEEA | 5 | 0.2 | 94.8 | iPA | Water/DGEEA |
| Example 21 | $C_6F_{13}$—$C_2H_4$—$P(O)(OH)_2$ | 0.1 | Water/DGEEA | 5 | 0 | 95 | Water/DGEEA | — |
| Example 22 | $C_6F_{13}$—$C_2H_4$—$P(O)(OH)_2$ | 0.1 | Water/iPA | 70 | 30 | 0 | iPA | Water |
| Example 23 | $C_6F_{13}$—$C_2H_4$—$P(O)(OH)_2$ | 1 | Water/iPA | 70 | 30 | 0 | iPA | Water |
| Example 24 | $C_8H_{17}$—$P(O)(OH)_2$ | 0.2 | Water/iPA/DGEEA | 5 | 0.2 | 94.8 | iPA | Water/DGEEA |
| Example 25 | $C_6F_{13}$—$C_2H_4$—$P(O)(OH)_2$ | 0.1 | Water/iPA/DGEEA | 5 | 0.2 | 94.8 | iPA | Water/DGEEA |
| Example 26 | $C_6F_{13}$—$C_2H_4$—$P(O)(OH)_2$ | 0.5 | Water/iPA/DGEEA | 5 | 1 | 94 | iPA | Water/DGEEA |
| Example 27 | $C_6F_{13}$—$C_2H_4$—$P(O)(OH)_2$ | 0.1 | Water/iPA | 70 | 30 | 0 | iPA | Water |
| Comparative Example 1 | $C_6F_{13}$—$C_2H_4$—$P(O)(OH)_2$ | 0.1 | Water/iPA/DGEEA | 0.5 | 0.2 | 99.3 | iPA | Water/DGEEA |
| Comparative Example 2 | $C_6F_{13}$—$C_2H_4$—$P(O)(OH)_2$ | 0.1 | Water/DGEEA | 0.5 | 0 | 99.5 | Water/DGEEA | — |
| Comparative Example 3 | $C_6F_{13}$—$C_2H_4$—$P(O)(OH)_2$ | 3 | Water/iPA/DGEEA | 3 | 40 | 57 | iPA | Water/DGEEA |
| Comparative Example 4 | $C_6F_{13}$—$C_2H_4$—$P(O)(OH)_2$ | 10 | Water/iPA/DGEEA | 3 | 50 | 47 | iPA | Water/DGEEA |
| Comparative Example 5 | $C_6F_{13}$—$C_2H_4$—$P(O)(OH)_2$ | 0.1 | Water/iPA | 85 | 15 | 0 | iPA | Water |
| Comparative Example 6 | $C_6F_{13}$—$C_2H_4$—$P(O)(OH)_2$ | 0.1 | nOA/DGEEA | 0 | 0 | 100 | nOA/DGEEA | — |

TABLE 1-continued

| | Temperature for Protective Film-Forming Step [°C.] | Cleaning Liquid B | Solubility of Protective Film Forming Agent (Dissolution Time) | Storage Stability at Low Temperatures 0°C. | Storage Stability at Low Temperatures −30°C. | Wafer | Initial Contact Angle [°] | Contact Angle after surface Treatment [°] | Capillary Force [MN/m²] <Calculated Value> | Removability of Protective Film (Contrast Angle [°]) | Surface Smoothness (Δ Ra [nm]) |
|---|---|---|---|---|---|---|---|---|---|---|---|
| Example 1 | 25 | Water | ⊚ (≤1 min) | ◯ | ◯ | TiN | <10 | 92 | 0.1 | <10 | Within ±0.5 |
| Example 2 | 25 | Water | ⊚ (≤1 min) | ◯ | ◯ | TiN | <10 | 92 | 0.1 | <10 | Within ±0.5 |
| Example 3 | 25 | Water | ⊚ (≤1 min) | ◯ | ◯ | TiN | <10 | 90 | 0 | <10 | Within ±0.5 |
| Example 4 | 25 | Water | ⊚ (≤1 min) | ◯ | ◯ | TiN | <10 | 90 | 0 | <10 | Within ±0.5 |
| Example 5 | 25 | Water | ⊚ (≤1 min) | ◯ | ◯ | TiN | <10 | 90 | 0 | <10 | Within ±0.5 |
| Example 6 | 25 | Water | ⊚ (≤1 min) | ◯ | X | TiN | <10 | 90 | 0 | <10 | Within ±0.5 |
| Example 7 | 25 | Water | ⊚ (≤1 min) | ◯ | ◯ | TiN | <10 | 90 | 0 | <10 | Within ±0.5 |
| Example 8 | 25 | Water | ⊚ (≤1 min) | ◯ | X | TiN | <10 | 90 | 0 | <10 | Within ±0.5 |
| Example 9 | 25 | Water | ◯ (≤1 h) | ◯ | ◯ | TiN | <10 | 90 | 0 | <10 | Within ±0.5 |
| Example 10 | 25 | Water | ◯ (≤1 h) | ◯ | X | TiN | <10 | 90 | 0 | <10 | Within ±0.5 |
| Example 11 | 25 | Water | ◯ (≤3 min) | ◯ | ◯ | TiN | <10 | 70 | 1.1 | <10 | Within ±0.5 |
| Example 12 | 25 | Water | ◯ (≤1 h) | ◯ | ◯ | TiN | <10 | 90 | 0 | <10 | Within ±0.5 |
| Example 13 | 25 | Water | ⊚ (≤1 min) | ◯ | ◯ | TiN | <10 | 96 | 0.3 | <10 | Within ±0.5 |
| Example 14 | 25 | Water | ⊚ (≤1 min) | ◯ | ◯ | TiN | <10 | 96 | 0.3 | <10 | Within ±0.5 |
| Example 15 | 25 | Water | ⊚ (≤1 min) | ◯ | ◯ | TiN | <10 | 96 | 0.3 | <10 | Within ±0.5 |
| Example 16 | 25 | Water | ⊚ (≤1 min) | ◯ | ◯ | TiN | <10 | 96 | 0.3 | <10 | Within ±0.5 |
| Example 17 | 25 | Water | ◯ (≤1 h) | ◯ | ◯ | TiN | <10 | 96 | 0.3 | <10 | Within ±0.5 |
| Example 18 | 25 | Water | ⊚ (≤1 min) | ◯ | ◯ | TiN | <10 | 96 | 0.3 | <10 | Within ±0.5 |
| Example 19 | 25 | Water | ◯ (≤1 h) | ◯ | ◯ | TiN | <10 | 96 | 0.3 | <10 | Within ±0.5 |
| Example 20 | 25 | iPA | ⊚ (≤1 min) | ◯ | ◯ | TiN | <10 | 108 | 1 | <10 | Within ±0.5 |
| Example 21 | 25 | iPA | ◯ (≤1 h) | ◯ | ◯ | TiN | <10 | 108 | 1 | <10 | Within ±0.5 |
| Example 22 | 25 | iPA | ⊚ (≤1 min) | ◯ | ◯ | TiN | <10 | 110 | 1.1 | <10 | Within ±0.5 |
| Example 23 | 25 | iPA | ⊚ (≤1 min) | ◯ | ◯ | TiN | <10 | 110 | 1.1 | <10 | Within ±0.5 |
| Example 24 | 25 | iPA | ⊚ (≤1 min) | ◯ | ◯ | TiN | <10 | 100 | 0.6 | <10 | Within ±0.5 |
| Example 25 | 45 | Water | ⊚ (≤1 min) | ◯ | ◯ | Ru | <10 | 78 | 0.7 | <10 | Within ±0.5 |
| Example 26 | 45 | Water | ⊚ (≤1 min) | ◯ | ◯ | Ru | <10 | 78 | 0.7 | <10 | Within ±0.5 |
| Example 27 | 45 | Water | ⊚ (≤1 min) | ◯ | ◯ | Ru | <10 | 76 | 0.8 | <10 | Within ±0.5 |
| Comparative Example 1 | 25 | Water | ⊚ (≤1 min) | X | — | TiN | <10 | 90 | 0 | <10 | Within ±0.5 |
| Comparative Example 2 | 25 | Water | ◯ (≤1 h) | X | — | TiN | <10 | 90 | 0 | <10 | Within ±0.5 |
| Comparative Example 3 | 25 | Water | ⊚ (≤1 min) | X | — | TiN | <10 | 90 | 0 | <10 | Within ±0.5 |
| Comparative Example 4 | 25 | — | X | — | — | TiN | <10 | — | — | — | — |
| Comparative Example 5 | 25 | — | ⊚ (≤1 min) | X | — | TiN | <10 | — | — | — | — |
| Comparative Example 6 | 25 | — | X | — | — | TiN | <10 | — | — | — | — |

Examples 2 to 24

Upon modifying the conditions employed in Example 1 (as to the protective film forming agent, the protective film forming agent concentration, the solvent for the liquid chemical for forming a protective film, the order of producing the liquid chemical for forming a protective film (a first solvent and a second solvent), the temperature during the protective film-forming step, and the cleaning liquid B used in the subsequent cleaning step), a surface treatment was conducted on wafers, followed by evaluation of these. The results are shown in Table 1.

Incidentally, in Table, "$C_8H_{17}P(O)(OH)_2$" means octylphosphonic acid, "PGME" means propylene glycol monomethyl ether, "DPGMEA" means dipropylene glycol monomethyl ether acetate, and "PGMEA" means propylene glycol monomethyl ether acetate.

Example 25

(II-1) Preparation of Liquid Chemical for Forming Protective Film

A mixture of: 0.1 g of perfluorohexylethylphosphonic acid [$C_6F_{13}C_2H_4P(O)(OH)_2$] that serves as a water-repellent protective film forming agent; and 0.2 g of iPA was stirred at 25° C. to dissolve it. The thus obtained solution was mixed with 99.8 g of a solvent obtained by combining DGEEA and water at a mass ratio of 94.8:5, with which the water-repellent protective film forming agent was dissolved within 1 minute and a uniform, clear, colorless solution was obtained. The solution was stirred for an additional 1 hour, thereby obtaining a liquid chemical for forming a protective film which liquid chemical had the protective film forming agent concentration of 0.1 mass %. Additionally, the appearance of the liquid chemical was visually observed, after cooling the liquid chemical to 0° C. or −30° C. for 24 hours and then bringing it back to room temperature (25° C.). As a result, the liquid chemical kept a condition of the uniform, clear, colorless solution even after being stored at 0° C. and precipitation of a solid matter was not detected in the liquid chemical, from which it was confirmed that the storage stability at low temperatures was excellently exhibited. Furthermore, precipitation of a solid matter was also not detected in the liquid chemical even after storing the liquid chemical at −30° C., from which it was confirmed that the storage stability at low temperatures was enormously excellently exhibited.

(II-2) Wafer Cleaning Step (Pretreatment Step)

As a pretreatment step 2, a wafer having a smooth ruthenium film (a silicon wafer formed having on its surface a ruthenium layer of 300 nm thickness) was immersed in 1 mass % aqueous ammonia for 1 minute at room temperature, and then immersed in pure water for 1 minute. Furthermore, as a pretreatment step 3, the wafer was immersed in iPA for 1 minute.

(II-3) From Step of Forming Protective Film on Wafer to Drying Step

In a protective film-forming step, the wafer having a ruthenium film was immersed in the liquid chemical for forming a protective film which liquid chemical had been prepared according to the "(II-1) Preparation of Liquid Chemical for forming Protective Film" section, for 10 minutes at 45° C., thereby causing adsorption of a protective film forming agent to form a protective film on the wafer surface. Thereafter the wafer was taken out of the liquid chemical for forming a protective film. Then, a subsequent cleaning step was conducted in such a manner as to immerse the wafer having a ruthenium film in water serving as a cleaning liquid B for 1 minute. In a drying step, the wafer having a ruthenium film was taken out of water, followed by blowing air to remove the water from the surface.

As a result of evaluating the thus obtained wafer having a ruthenium film in a manner discussed in the above [Method for Evaluating Wafer to which Liquid Chemical for forming Protective Film is provided] section, a wafer having an initial contact angle of smaller than 10° before the surface treatment was confirmed to have a contact angle of 78° after the surface treatment, as shown in Table 1, from which it was confirmed that the water repellency-imparting effect was obtained. Additionally, as a result of calculating the capillary force (in the case where water was retained) from the equation discussed in the above [Evaluation of Capillary Force] section, the capillary force was so small as to be 0.7 $MN/m^2$. Moreover, the contact angle after UV irradiation was smaller than 10°, which means that removal of the protective film was achieved. Furthermore, the ΔRa value of the wafer after ITV irradiation was within ±0.5 nm, with which it was confirmed that the wafer was not eroded at the time of cleaning and that residues of the protective film did not remain after UV irradiation.

Examples 26 to 27

Upon modifying the conditions employed in Example 25 (as to the protective film forming agent concentration, the solvent for the liquid chemical for forming a protective film, and the order of producing the liquid chemical for forming a protective film (a first solvent and a second solvent)), a surface treatment was conducted on wafers, followed by evaluation of these. The results are shown in Table 1.

Comparative Example 1

The procedure of Example 1 was repeated with the exception that water had a concentration of 0.5 mass % relative to the total amount of 100 mass % of the solvent in the liquid chemical for forming a protective film. The results of evaluation are shown in Table 1. As a result of visually observing the appearance after cooling the liquid chemical to 0° C. for 24 hours and then bringing it back to room temperature (25° C.), precipitation of a solid matter was recognized.

Comparative Example 2

The procedure of Example 9 was repeated with the exception that water had a concentration of 0.5 mass % relative to the total amount of 100 mass % of the solvent in the liquid chemical for forming a protective film. The results of evaluation are shown in Table 1. As a result of visually observing the appearance after cooling the liquid chemical to 0° C. for 24 hours and then bringing it back to room temperature (25° C.), precipitation of a solid matter was recognized.

Comparative Example 3

The procedure of Example 1 was repeated with the exception that the water-repellent protective film forming agent concentration was 3 mass % and that the concentration of water and the concentration of iPA relative to the total amount of 100 mass % of the solvent in the liquid chemical for forming a protective film were 3 mass % and 40 mass %, respectively. The results of evaluation are shown in Table 1. As a result of visually observing the appearance after cooling the liquid chemical to 0° C. for 24 hours and then bringing it back to room temperature (25° C.), precipitation of a solid matter was recognized.

Comparative Example 4

The procedure of Example 1 was repeated with the exception that the water-repellent protective film forming agent concentration was 10 mass % and that the concentration of water and the concentration of iPA relative to the total amount of 100 mass % of the solvent in the liquid chemical for forming a protective film were 3 mass % and 50 mass %, respectively. The results of evaluation are shown in Table 1. Though the water-repellent protective film forming agent was mixed into iPA (as a first solvent) and into water and DGEEA (as second solvents) at 25° C. in the preparation of the liquid chemical for forming a protective film and then stirred for 1 hour or further, the protective film forming agent was not dissolved therein and therefore a uniform liquid chemical was not obtained.

Comparative Example 5

The procedure of Example 13 was repeated with the exception that water had a concentration of 85 mass % and iPA had a concentration of 15 mass % relative to the total amount of 100 mass % of the solvent in the liquid chemical for forming a protective film. The results of evaluation are shown in Table 1. As a result of visually observing the appearance after cooling the liquid chemical to 0° C. for 24 hours and then bringing it back to room temperature (25° C.), precipitation of a solid matter was recognized.

Comparative Example 6

The procedure of Example 10 was repeated with the exception that 1-octanol (nOA) serving as an alcohol having a carbon number of 8 was used instead of iPA. The results of evaluation are shown in Table 1. Though the water-repellent protective film forming agent was mixed with the solvent (1-octanol (nOA) and DGEEA) at 25° C. for 1 hour or further in the preparation of the liquid chemical for forming a protective film, the protective film forming agent was not dissolved therein and therefore a uniform liquid chemical was not obtained.

EXPLANATION OF REFERENCE NUMERALS

1 Wafer
2 Uneven pattern of a surface of the wafer
3 Projected portions of the pattern
4 Recessed portions of the pattern
5 Widths of the recessed portions
6 Heights of the projected portions
7 Widths of the projected portions
8 Liquid chemical for forming a protective film, retained in the recessed portions 4
9 Liquid retained in the recessed portions 4
10 Protective film

The invention claimed is:

1. A liquid chemical for forming a water-repellent protective film, the liquid chemical being for forming a water-repellent protective film on a wafer having at its surface an uneven pattern and containing at least one kind of element selected from the group consisting of titanium, tungsten, aluminum, copper, tin, tantalum and ruthenium at surfaces of recessed portions of the uneven pattern, the water-repellent protective film being formed at least on the surfaces of the recessed portions subsequent to a step of cleaning the wafer and prior to a step of drying the wafer, the liquid chemical for forming a water-repellent protective film comprising:

a water-repellent protective film forming agent represented by the general formula [1]

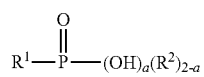

[1]

wherein $R^1$ represents a $C_1$-$C_{18}$ monovalent hydrocarbon group the hydrogen elements of which may partially or entirely be replaced with a fluorine element(s), $R^2$ mutually independently represents a monovalent organic group having a $C_1$-$C_{18}$ hydrocarbon group the hydrogen elements of which may partially or entirely be replaced with a fluorine element(s), and "a" is an integer of from 0 to 2; and a solvent, wherein the solvent comprises an alcohol having a carbon number of 6 or less; and water, the water-repellent protective film forming agent is present in a concentration of 0.05 to 2 mass % relative to the total amount of 100 mass % of the liquid chemical for forming a water-repellent protective film, water is present in a concentration of 1 to 75 mass % relative to the total amount of 100 mass % of the solvent, the alcohol is present in a concentration of 0.05 to 60 mass % relative to the total amount of 100 mass % of the solvent, and the total concentration of the alcohol and water is 1.05 to 100 mass % relative to the total amount of 100 mass % of the solvent.

2. A liquid chemical for forming a water-repellent protective film, as claimed in claim 1, wherein, the water-repellent protective film forming agent is a compound represented by the following general formula

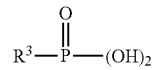

[2]

wherein $R^3$ represents a $C_1$-$C_{18}$ monovalent hydrocarbon group the hydrogen elements of which may partially or entirely be replaced with a fluorine element(s).

* * * * *